United States Patent [19]
Harness

[11] Patent Number: 5,729,709
[45] Date of Patent: Mar. 17, 1998

[54] MEMORY CONTROLLER WITH BURST ADDRESSING CIRCUIT

[75] Inventor: Jeffrey F. Harness, Hillsboro, Oreg.

[73] Assignee: Intel Corporation, Santa Clara, Calif.

[21] Appl. No.: 618,611

[22] Filed: Mar. 21, 1996

Related U.S. Application Data

[63] Continuation of Ser. No. 150,850, Nov. 12, 1993, abandoned.
[51] Int. Cl.$^6$ .............................. G11C 7/00; G06F 13/28
[52] U.S. Cl. ................... 395/405; 395/855; 365/230.03; 365/230.04
[58] Field of Search .................................. 395/454, 484, 395/421.07, 855; 365/230.03, 230.04

[56] References Cited

U.S. PATENT DOCUMENTS

| | | | |
|---|---|---|---|
| 4,583,162 | 4/1986 | Prill | 395/421.03 |
| 5,218,686 | 6/1993 | Thayer | 395/550 |
| 5,261,064 | 11/1993 | Wyland | 395/421.01 |
| 5,265,053 | 11/1993 | Naradone et al. | 365/193 |
| 5,285,421 | 2/1994 | Young et al. | 365/230.04 |
| 5,289,584 | 2/1994 | Thome et al. | 395/436 |
| 5,345,573 | 9/1994 | Bowden, III et al. | 395/421.07 |
| 5,453,957 | 9/1995 | Norris et al. | 365/230.04 |

OTHER PUBLICATIONS

—"82369 DRAM Controller," Intel Peripheral Components, pp. 1–522 through 1–700 (1993).

Primary Examiner—Jack A. Lane
Attorney, Agent, or Firm—Blakely, Sokoloff, Taylor & Zafman

[57] ABSTRACT

An improved memory controller of a computer system is described. The computer system includes a microprocessor and a memory coupled to the memory controller that controls access to the memory. An interface circuit is coupled to the microprocessor for receiving a first address to access the memory. The memory includes a first memory bank and a second memory bank. A memory control circuit is coupled to the interface circuit for generating control signals to access the memory. An address generation circuit is coupled to receive the first address from the interface circuit for generating a first memory address and a second memory address in accordance with the first address to access the memory during a burst access to the memory from the microprocessor. The address generation circuit further comprises circuitry for generating and applying the first memory address sequentially to the first and second memory banks and circuitry for generating and applying the second memory address sequentially to the first and second memory banks. The second memory address is generated by inverting at least the lowest order address bit in the first memory address. Access time of the burst access is minimized by using the first microprocessor memory address and generating a second memory address therefrom.

44 Claims, 6 Drawing Sheets

MEMORY CONTROLLER WITH BURST ADDRESSING CIRCUIT

This is a continuation of application Ser. No. 08/150,850, filed Nov. 12, 1993, now abandoned.

FIELD OF THE INVENTION

The present invention pertains to the field of computer systems. More particularly, this invention relates to a memory controller with a burst addressing circuit to access a two-way interleaved memory system, wherein the burst addressing circuit can predict the subsequent addresses of a burst access such that the access time of the memory system is minimized and system performance is improved.

BACKGROUND OF THE INVENTION

In a prior microprocessor based computer system having a memory, a microprocessor, and other circuitry, it is necessary for the microprocessor to access the memory for data or codes (i.e., programs). The memory access operation typically involves latching an address to the memory, decoding the address in the memory, and accessing the memory array of the memory in accordance with the address decoded. When the memory is a volatile memory (e.g., a dynamic random access memory), the memory access operation also involves precharging nodes and controlling refreshing, etc. These operations typically introduce wait states in microprocessor operations which typically costs a considerable amount of processing time of the microprocessor.

The advances in the microprocessor technologies have led to the creation of high speed and high performance microprocessors. However, interfacing such a high speed, high performance microprocessor to a DRAM that operates slower than the microprocessor derogates microprocessor performance and hence, system performance.

One prior solution to the problem is to design a DRAM controller that interfaces with the microprocessor and the DRAM device. A prior DRAM controller typically provides complete control and timing for the DRAM device. The microprocessor interfaces with the DRAM controller. Other system bus masters may also interface with the DRAM controller. The DRAM controller decodes CPU to DRAM access commands, translates the microprocessor address to the proper DRAM row and column address, and generates the proper DRAM control timing signals required to successfully complete the DRAM access cycle.

One disadvantage associated with the prior solution is that the DRAM controller is typically idle and has to wait for the next address from the CPU to arrive when the DRAM controller finishes a memory access and the data fetched is being transferred to the CPU. This is especially disadvantageous when the memory access is a burst access to the DRAM. During a burst access, the DRAM controller undergoes a number of memory accesses based on a number of burst access addresses. Each of the burst access addresses needs to be supplied to the prior DRAM controller from the CPU for each of the memory accesses. This typically causes delays to the burst access. As is known, the CPU typically needs to wait for the data transfer for an access to complete before it can issue the next address. In this case, wait states are introduced and the speed of the burst access is adversely affected.

SUMMARY AND OBJECTS OF THE INVENTION

One of the objects of the present invention is to increase the system performance of a computer system.

Another object of the present invention is to reduce the system cost of a computer system.

A further object of the present invention is to increase the system performance of the computer system by providing address prediction for the burst memory access of the computer system.

A still further object of the present invention is to minimize the wait states during a memory burst access operation of the computer system such that the system performance of the system is improved.

An improved memory controller of a computer system is described. The computer system includes a microprocessor and a memory coupled to the memory controller that controls access to the memory. An interface circuit in the memory controller is coupled to the microprocessor for receiving a first address to access the memory. The memory includes a first memory bank and a second memory bank. A memory control circuit also in the memory controller is coupled to the interface circuit for generating control signals to access the memory. An address generation circuit also in the memory controller is coupled to receive at least part of the first address from the interface circuit for helping generate a first memory address and a second memory address in accordance with the first address to access the memory during a burst access to the memory from the microprocessor. The address generation circuit further comprises circuitry for generating and applying at least part of the first memory address sequentially to the first and second memory banks and circuitry for generating and applying the second memory address sequentially to the first and second memory banks. The second memory address is generated by inverting at least the lowest order address bit ($A_0$) in the first memory address Access time of the burst access is minimized by using the first microprocessor memory address and generating a second memory address therefrom.

A computer system also is described. The computer system includes a microprocessor, an interleaved memory having a first memory bank and a second memory bank, and a memory controller coupled to the memory and the microprocessor for controlling access to the memory. The memory controller further includes an interface circuit coupled to the microprocessor for receiving a first address to access the memory. A memory control circuit is coupled to the interface circuit for generating control signals to access the memory. An address generation circuit is coupled to receive at least part of the first address from the interface circuit for generating at least part of a first memory address and a second memory address in accordance with the first address to access the memory during a burst access to the memory from the microprocessor. The address generation circuit further comprises circuitry for generating and applying the first memory address sequentially to at least part of the first and second memory banks and circuitry for generating and applying at least part of the second memory address sequentially to the first and second memory banks. The second memory address is generated by inverting at least the lowest order address bit ($A_0$) in the first address Access time of the burst access is minimized by using the first microprocessor memory address and, generating a second memory address therefrom.

Other objects, features, and advantages of the present invention will be apparent from the accompanying drawings and from the detailed description that follows below.

BRIEF DESCRIPTION OF THE DRAWINGS

The present invention is illustrated by way of example and is not limited by the figures of the accompanying drawings, in which like references indicate similar elements and in which.

DETAILED DESCRIPTION

Figure 1:
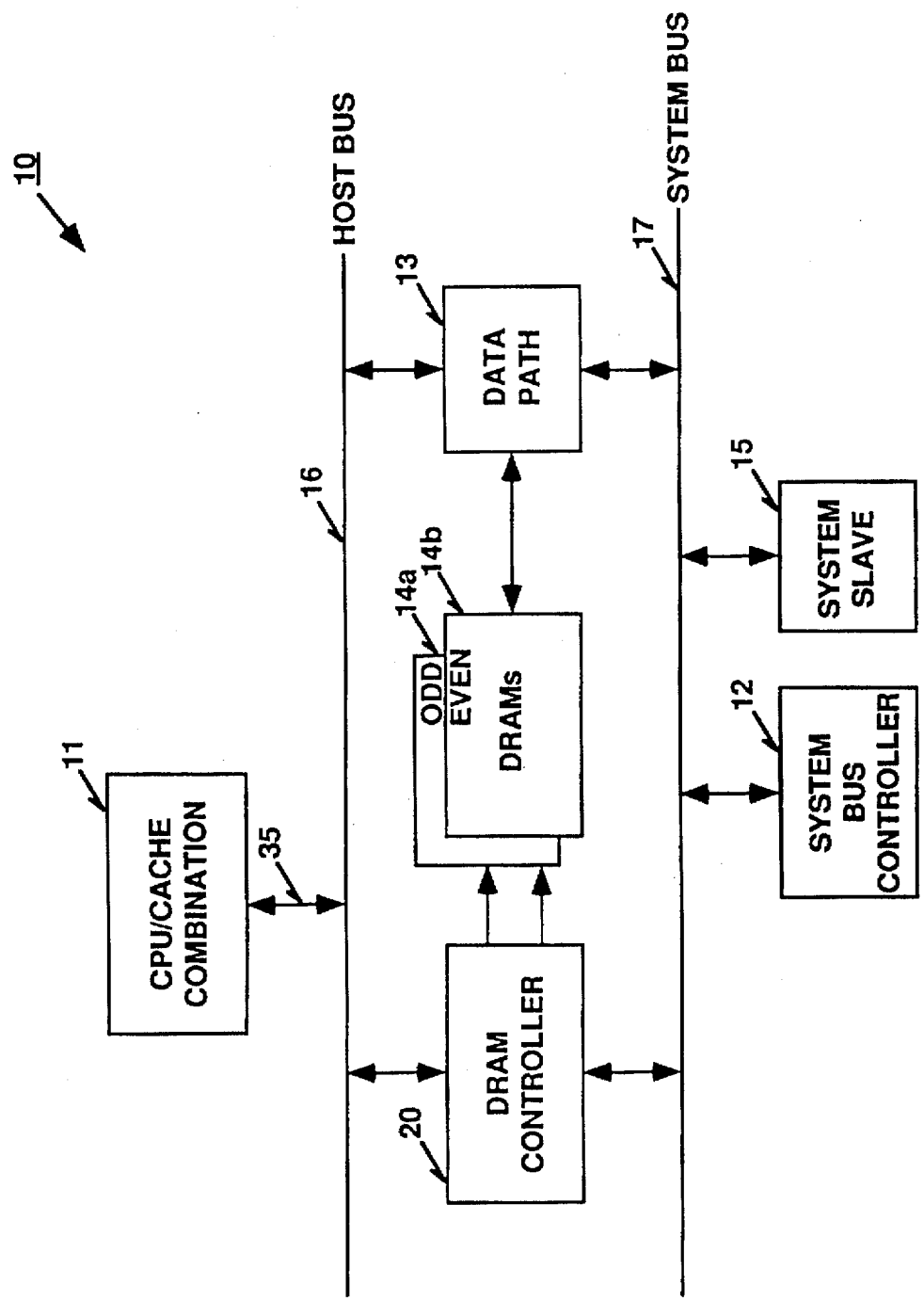
FIG. 1 is a block diagram of a computer system that includes a DRAM controller which implements an embodiment of the present invention, wherein the computer system also includes a two-way interleaved DRAM.

FIG. 1 illustrates an architecture of a microprocessor based computer system 10, which implements an embodiment of the present invention. FIG. 1 illustrates one configuration of computer system 10.

Referring to FIG. 1, computer system 10 includes a host bus 16 connected by bus 35 to a central processing unit ("CPU") 11. CPU 11 typically comprises a microprocessor and a cache connected to the microprocessor. In one embodiment, CPU 11 includes a microprocessor, a co-processor, a cache, and a cache controller for handling access to the cache by the microprocessor. In a further embodiment, the elements mentioned above may reside on a single semiconductor substrate. In other embodiments, more or fewer than the elements mentioned above may be included in CPU 11.

Computer system 10 also includes DRAMs 14a and 14b and a DRAM controller 20. DRAMs 14a–14b are DRAM arrays and DRAM 14a represents the odd DRAM array and DRAM 14b represents the even DRAM array. In alternative embodiments, DRAMs 14a and 14b may be replaced with other types of volatile memories and DRAM controller 20 may be replaced with other types of memory controllers. In alternative embodiments, DRAMs 14a–14b may have more or fewer than two memory arrays.

DRAM controller 20 controls access to DRAMs 14a–14b. CPU 11 therefore can access DRAMs 14a–14b via host bus 16 and via DRAM controller 20. The data read from DRAMs 14a–14b can be forwarded to CPU 11 via a data path 13 and host bus 16. In one embodiment, DRAM controller 20 is a dual port memory controller, which will be described in more detail below.

Computer system 10 also includes a system bus 17 and a system bus controller 12. System bus controller 12 is coupled to system bus 17 to control the activities on system bus 17. System bus controller 12 also controls the system access to DRAMs 14a–14b via DRAM controller 20. System bus controller 12 controls access by system master 18 to system bus 17. In alternative embodiments, system bus 17 may be connected to more than one system master 18.

System bus 17 is also connected to a system slave 15. A system slave only accepts cycles from various masters. A system master can generate memory or I/O cycles. In alternative embodiments, system bus 17 may be connected to more than one system slave. FIG. 1 only illustrates one system master and one system slave for illustration purposes. In practice, many more system masters and slaves can be connected to system bus 17.

System bus controller 12 controls the system devices (i.e., system masters and slaves) connected to system bus 17 to access DRAMs 14a–14b via DRAM controller 20. System bus controller 12 also acts as a gateway for CPU 11 to access system slave 15 connected to system bus 17 via DRAM controller 20.

As described above, DRAM controller 20 can be a dual port memory controller. In this embodiment DRAM controller 20 includes two ports (i.e., address gateways). One port is connected to CPU 11 via host bus 16. This port (hereinafter referred to as "host port") provides a path for CPU 11 to DRAMs 14a–14b and to system bus 17 via system bus controller 12.

The other port of DRAM controller 20 is connected to system bus controller 12 via system bus 17. This port (hereinafter referred to as "system port") is exclusively used by the system devices coupled to system bus 17. This port of DRAM controller 20 acts as the gateway to and from system bus 17.

DRAMs 14a–14b are coupled to data path 13. Data path 13 is also connected to host bus 16 via bus 29 and to system bus 17 via bus 28. Data path 13 is used to transfer data read from DRAMs 14a–14b to one of buses 16–17, and to transfer data written into DRAMs 14a–14b from either bus 16 or bus 17. In one embodiment, data path 13 is implemented by a plurality of buffers. Data path 13 is controlled by DRAM controller 20, CPU 11, and system bus controller 12. In one embodiment, data path 13 is part of DRAM controller 20. In a further embodiment, DRAM controller 20 and data path 13 reside on a single substrate.

Computer system 10 can be a synchronous system in which CPU 11, DRAM controller 20, and system bus controller 12 operate synchronously with each other. Computer system 10 can also be an asynchronous system in which CPU 11, DRAM controller 20, and system bus controller 12 operate asynchronously with each other. When computer system 10 is a synchronous system, CPU 11, DRAM controller 20, and system bus controller 12 all operate synchronously with a clock signal of the computer system. When computer system 10 is not a synchronous system, the interfaces to CPU 11, DRAM controller 20, and system bus controller 12 each must be synchronized with each other.

Figure 2:
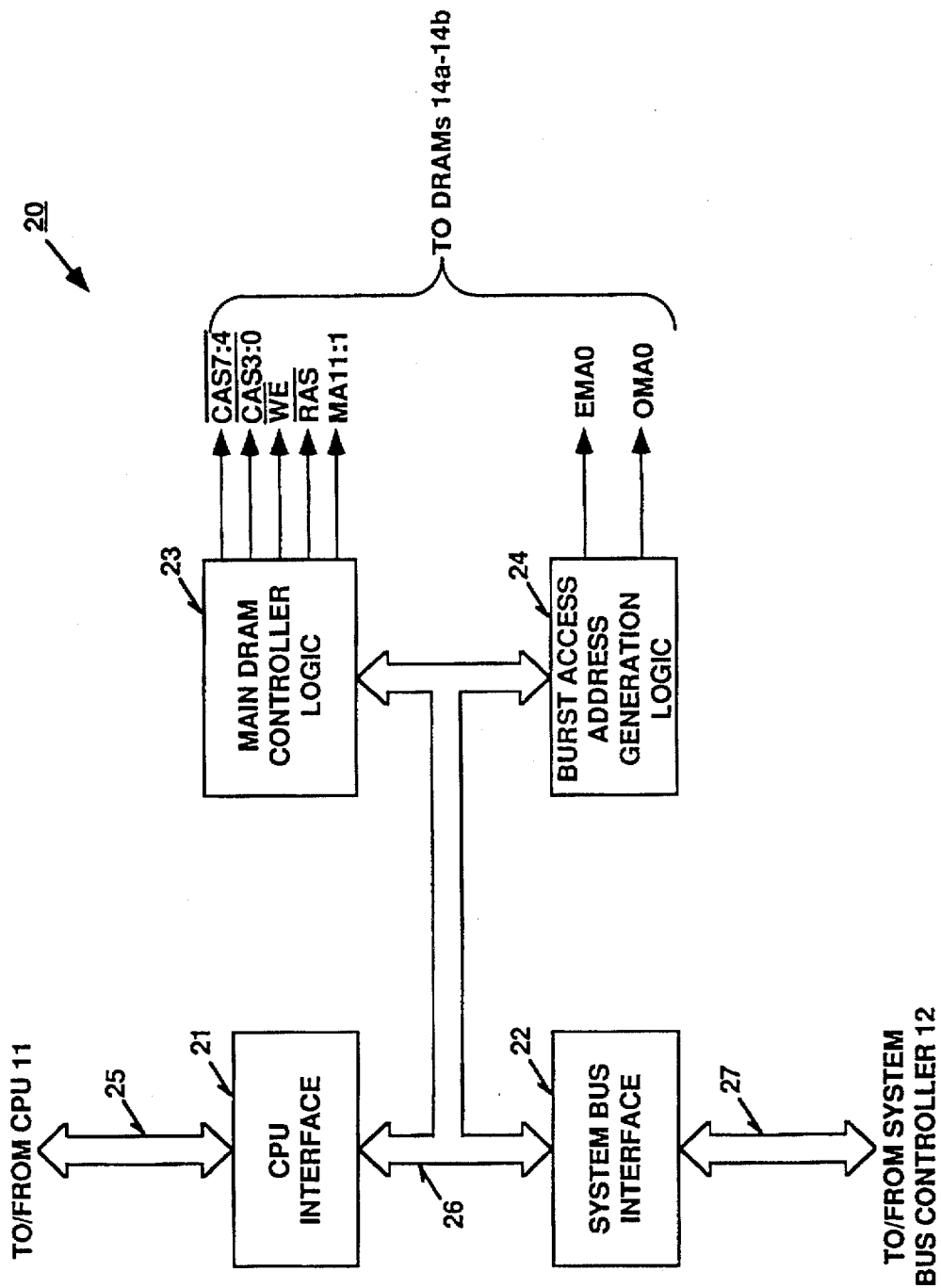
FIG. 2 is a block diagram of the DRAM controller in accordance with an embodiment of the present invention, wherein the DRAM controller includes a burst access control logic.

FIG. 2 illustrates in block diagram form the structure of DRAM controller 20. As can be seen from FIG. 2, DRAM controller 20 includes a CPU interface 21, a system bus interface 22, a main DRAM controller logic 23, and a burst access address generation logic 24. A bus 26 is connected among CPU interface 21, system bus interface 22, main DRAM controller logic 23, and burst access address generation logic 24. CPU interface 21 is used to interface with CPU 11 (FIG. 1) via bus 25. System bus interface 22 is used to interface with system bus controller 12 via bus 27. CPU interface 21 may receive the CPU memory access request and system bus access request from CPU 11. CPU interface 21 decodes the request received from CPU 11 and determines if the request is a memory access request or a system bus access request. If CPU interface 21 determines that the request is a memory access request, it then sends the memory access request to main DRAM controller logic 23 via bus 26. If the decoded access request is a system bus access request, CPU interface 21 supplies the request to system bus interface 22.

Likewise, system bus interface 22 receives an access request (i.e., cycle definition) from system bus controller 12 and determines if the request is bound for main DRAM controller logic 23 or not. If so, the decoded request is sent to main DRAM controller logic 23. If not, system bus interface 22 sends the request to CPU interface 21.

Main DRAM controller logic 23 is used to generate the control signals to access DRAMs 14a–14b. Main DRAM controller logic 23 also applies row and column addresses to DRAMs 14a–14b during the DRAM access cycles. Main DRAM controller logic 23 receives the memory access address from either CPU interface 21 or system bus interface 22 and decodes the memory access address into appropriate row and column addresses.

The memory access to DRAMs 14a–14b via DRAM controller 20 can be a read operation or a write operation. A memory read operation can be a regular read operation or a burst read operation. A regular read operation accesses one and only one address location in DRAMs 14a–14b. A burst read operation, however, accesses a number of address locations in DRAMs 14a–14b. In one embodiment, a burst read cycle accesses four address locations in DRAMs 14a–14b. Alternatively, a burst read cycle can access more or fewer than four address locations in DRAMs 14a–14b.

During a bust read cycle, DRAM controller 20 receives a lead-off address and a burst cycle definition at either CPU interface 21 or system bus interface 22. The lead-off address is then supplied to main DRAM controller logic 23. The lead-off address is the start address of the burst read. A portion of the lead-off address is also sent to burst access address generation logic 24 in order to generate the subsequent addresses for the burst read cycle.

Upon receiving the lead-off address and the decoded burst read request (burst cycle definition), main DRAM controller logic 23 generates the appropriate access control $\overline{WE}$, $\overline{CAS3:0}$, $\overline{CAS7:4}$, and $\overline{RAS}$ signals. The $\overline{WE}$ signal is the write enable signal that is active when the memory access is a write operation. The $\overline{CAS3:0}$ and $\overline{CAS7:4}$ signals are the column address strobe signals and are used to access the odd and even banks of DRAMs 14a–14b, respectively. The $\overline{RAS}$ signal is the row address strobe signal and is used to access the rows of DRAMs 14a–14b. The $\overline{CAS3:0}$ signal is the even bank column address strobe signal and the $\overline{CAS7:4}$ signal is the odd bank column address strobe signal. The $\overline{CAS3:0}$ signal is applied to DRAM 14b (FIG. 1) and the $\overline{CAS7:4}$ signal is applied to DRAM 14a (FIG. 1). When the lead-off address is directed to odd bank DRAM 14a, the $\overline{CAS7:4}$ signal is first generated. When the lead-off address is directed to even bank DRAM 14b, the $\overline{CAS3:0}$ signal is first generated. In one embodiment, the address bit $A_2$ of the lead-off address determines which of DRAMs 14a–14b the lead-off address is directed to.

In addition, the lead-off address is decoded into an appropriate row and column address in main DRAM controller logic 23. Main DRAM controller logic 23 then sequentially applies the row address and the column address to the selected one of DRAMs 14a–14b. The MA11:1 signal indicates the address bits $A_{11}$ through $A_1$ of the row and column addresses applied to DRAMs 14a–14b. As can be seen from FIG. 5, the MA11:1 outputs of logic 23 first apply the row address to the selected one Of DRAMs 14a–14b and then apply the column address to the selected one of DRAMs 14a–14b.

Referring again to FIG. 2, the row and column addresses generated in main DRAM controller logic 23 in accordance with the lead-off address, however, is not complete. The least significant address bit (i.e., the lowest order address bit $A_0$) of the column address is generated in burst access address generation logic 24. In addition, burst access address generation logic 24 controls logic 23 to alternately assert the $\overline{CAS7:4}$ and $\overline{CAS3:0}$ signals. By doing this, all the burst read addresses of a burst read cycle can be generated in DRAM controller 20 based on the lead-off address. Burst access address generation logic 24 first allows the low order address bit to be asserted to DRAMs 14a–14b. Address generation logic 24 then generates the least significant address bit of the column address based on the lead-off address. Similar to the remaining address bits $A_1$–$A_{11}$ of the column address, the least significant address bit is applied from burst access address generation logic 24 to both DRAMs 14a–14b. Which one of DRAMs 14a–14b latches in the column address depends on whether the $\overline{CAS3:0}$ signal is asserted or the $\overline{CAS7:4}$ signal is asserted. The $\overline{CAS7:4}$ and $\overline{CAS3:0}$ signals are alternately asserted. Which one of the $\overline{CAS7:4}$ and $\overline{CAS3:0}$ signals is first activated depends on the lead-off address. Burst access address generation logic 24 then toggles the least significant address bit of the column address and applies the toggled address bit to DRAMs 14a–14b. Burst access address generation logic 24 then causes logic 23 to again alternately assert the $\overline{CAS7:4}$ and $\overline{CAS3:0}$ signals to latch the toggled column address to DRAMs 14a–14b, respectively.

Figure 4:
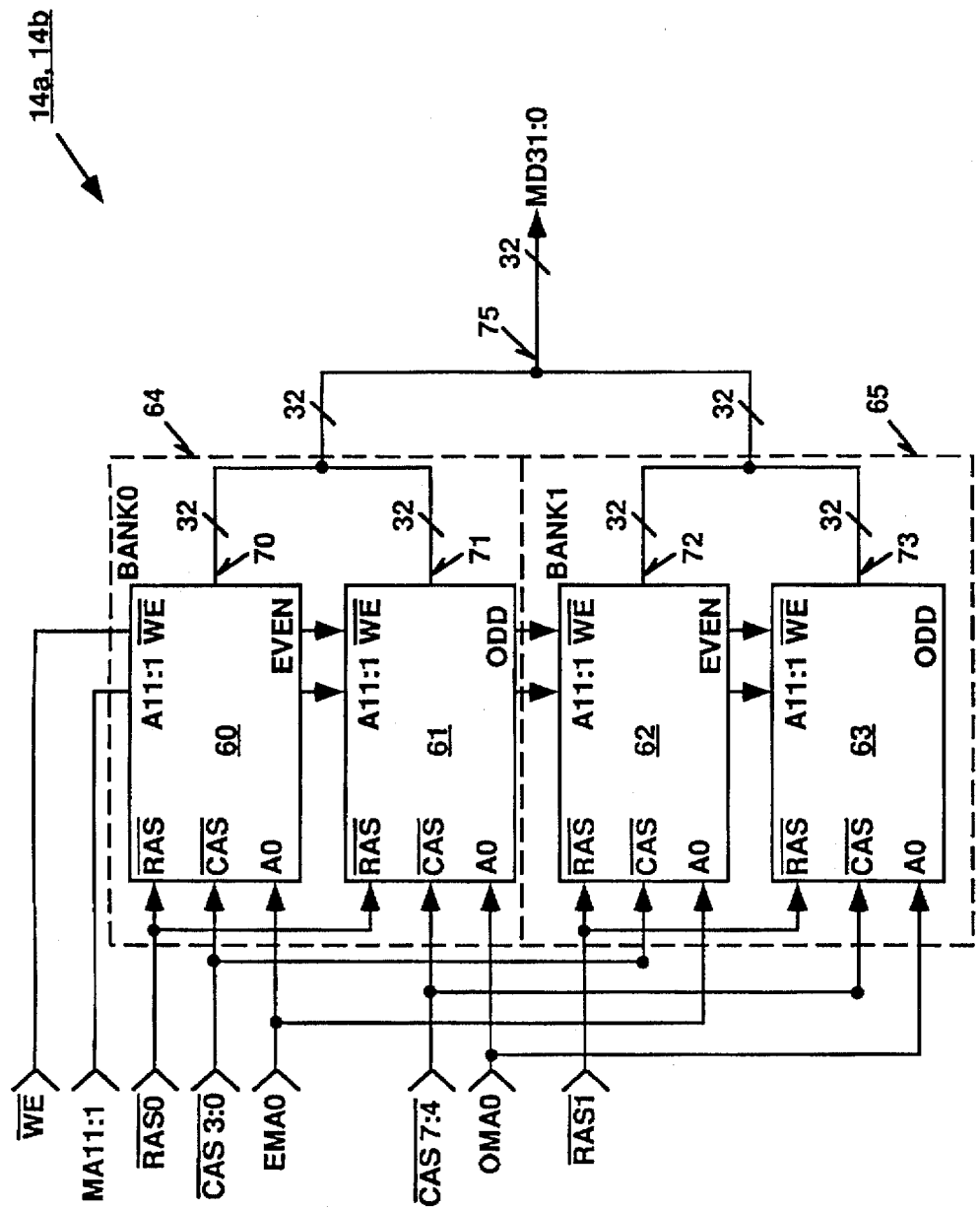
FIG. 4 shows the array structure of the two-way interleaved DRAM of FIG. 1.

Referring now to FIG. 4, the array configuration of DRAMs 14a–14b is shown. DRAMs 14a–14b shown in FIG. 4 are organized into four rows (i.e., $\overline{RAS3:0}$). FIG. 4 only illustrates two rows for purposes of simplicity. Each row in DRAMs 14a–14b includes two 32 bit banks (i.e., even bank and odd bank). For example, row 64 includes even bank 60 and odd bank 61. Row 65 includes even bank 62 and odd bank 63. All the even banks in the two rows together represent even bank DRAM 14b in FIG. 2 and all the odd banks in the two rows together represent odd bank DRAM 14a of FIG. 2. Each row of DRAMs 14a–14b is eight bytes wide (i.e., $\overline{CAS7:0}$. The two banks within a row are 2-way interleaved into a single 32-bit memory data bus. For example, banks 60 and 61 are interleaved into a single bus 75. Banks 62 and 63 are also interleaved into bus 75.

As shown in FIG. 4, the row and column addresses are applied to DRAMs 14a–14b via the MA11:1 inputs and EMA0 and OMA0 inputs. The MA11:1 inputs are connected to both the even and odd banks of each of the two rows of DRAMs 14a–14b. The EMA0 signal is applied to the even bank of each row and the OMA0 signal is applied to the odd bank of each row. The EMA0 signal indicates the lowest order address bit applied to the even bank and the OMA0 signal indicates the lowest order address bit applied to the odd bank. When the MA11:1 inputs receive the row address, the EMA0 and OMA0 signals indicate the lowest order address bit of the row address. When the MA11:1 inputs receive the column address, the EMA0 and OMA0 signals indicate the lowest order address bit of the column address. The $\overline{CAS3:0}$ signal is applied to the even bank of each of the rows and the $\overline{CAS7:4}$ signal is applied to the odd bank of each of the rows. The $\overline{RAS3:0}$ signal is also used to select each individual row of DRAMs 14a–14b. As can be seen from FIG. 4, the $\overline{RAS0}$ signal is used to select row 64 and the $\overline{RAS1}$ signal is used to select row 65.

Referring back to FIG. 2, burst access address generation logic 24 outputs the EMA0 signal and the OMA0 signal. As described above, the EMA0 signal is the $A_0$ bit (i.e., the least significant) of the address applied to the even bank of DRAMs 14a–14b. The OMA0 signal is the $A_0$ bit of the address applied to the odd bank of DRAMs 14a–14b. Before the EMA0 and OMA0 signals are toggled, the two signals assume the same logical value. When they both are toggled, they again assume the same logical value. When logic 23 applies a row address to DRAMs 14a–14b via the MA11:1 outputs, the EMA0 and OMA0 signals applied by logic 24 are the $A_0$ address bit of the row address. When logic 23 applies a column address to DRAMs 14a–14b via the MA11:1 outputs, the EMA0 and OMA0 signals are the $A_0$ address bit of the column address. The generation of the EMA0 and OMA0 signals will be described in more detail below, in conjunction with FIG. 3.

Figure 5:
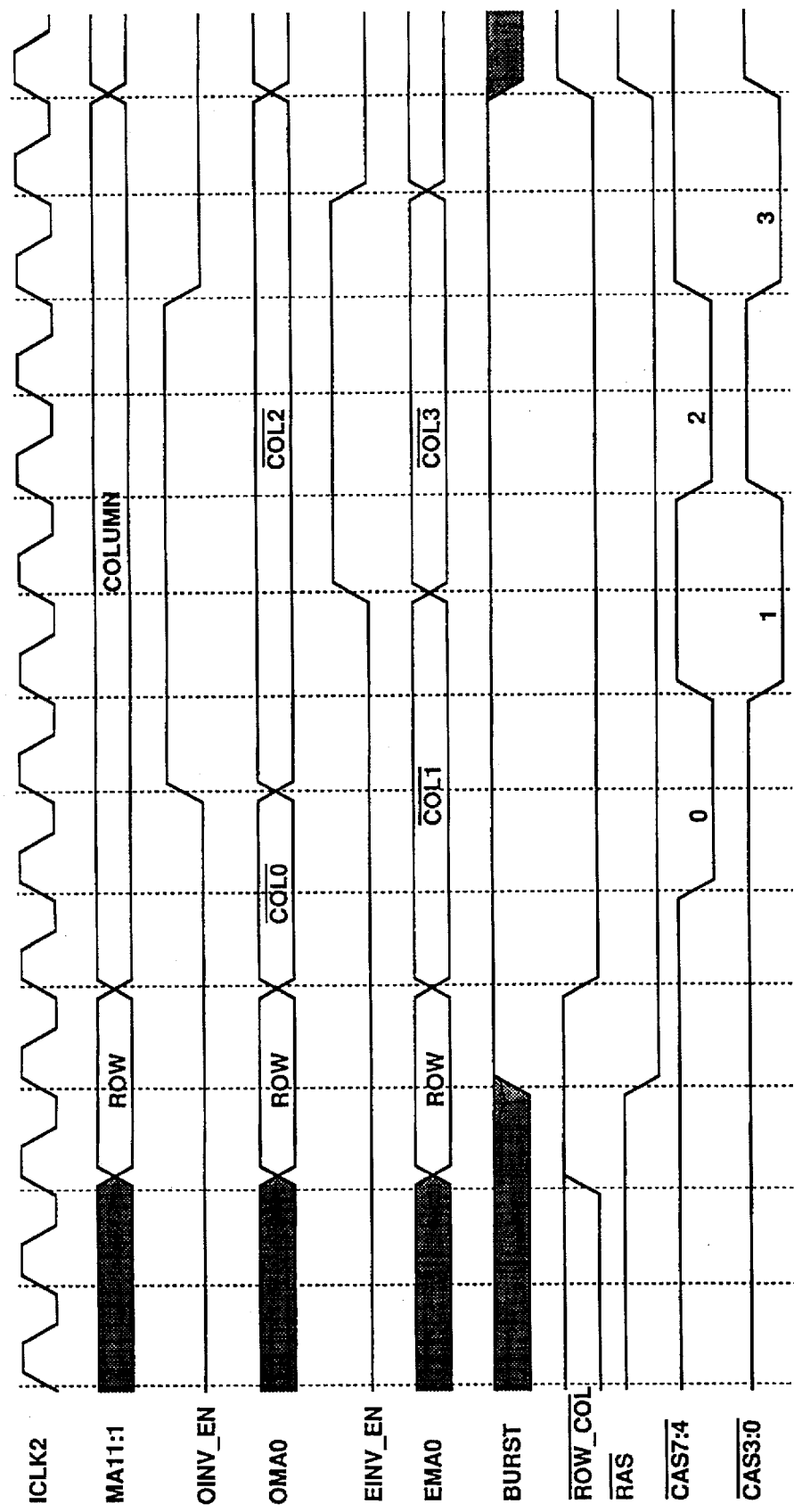
FIG. 5 is a timing diagram showing the relationship of the signals of FIGS. 3–4.

Referring now to FIGS. 2 and 4–5, burst access address generation logic 24 uses address order prediction to generate all subsequent burst addresses based upon the lead-off address of the burst read such that DRAM controller 20 can complete the burst access cycle without receiving all the burst access addresses. Burst access address generation logic 24 first causes the decoded lead-off address to be applied to one of DRAMs 14a–14b for the first read cycle of the burst read. The predicted subsequent burst addresses are then presented to DRAMs 14a–14b for the second, third, and fourth accesses of the burst read. The address prediction accomplished by burst access address generation logic 24 is as follows.

When the initial column address of the decoded lead-off address is directed, for example, to odd bank DRAM 14a, logic 24 then causes the same column address to be applied to even bank DRAM 14b during the second cycle of the burst read. This is done by asserting the $\overline{CAS3:0}$ signal and deasserting the $\overline{CAS7:4}$ signal. Burst access address generation logic 24 then toggles the lowest order address bit of the initial column address and applies the toggled column address to odd bank DRAM 14a during the third cycle of the burst read. At this time, logic 24 causes logic 23 to assert the $\overline{CAS7:4}$ signal and deassert the $\overline{CAS3:0}$ signal. Logic 24 then causes the toggled column address to be applied to even bank DRAM 14b by asserting the $\overline{CAS3:0}$ signal and deasserting the $\overline{CAS7:4}$ signal. This completes a four DWORD burst read operation.

When the burst read operation requires eight read cycles, logic 24 can repeat the process by toggling the second lowest order address bit of the column address and applying the toggled address to DRAMs 14a–14b alternately.

In summary, burst access address generation logic 24 generates all the burst column addresses for a burst read cycle based on the lead-off address. In addition, burst access address generation logic 24 also causes the first column address to be applied to the selected one of DRAMs 14a–14b by asserting the corresponding one of the $\overline{CAS3:0}$ and $\overline{CAS7:4}$ signals based on the lead-off address. During the second read cycle of the burst read operation, the first column address is again applied to DRAMs 14a–14b. At this time, logic 24 causes logic 23 to switch the $\overline{CAS}$ signal to apply the first column address to the one of DRAMs 14a–14b unselected in the first read cycle. For example, if the $\overline{CAS3:0}$ signal is asserted during the first cycle of the burst read, logic 24 then causes the $\overline{CAS7:4}$ to be asserted during the second read cycle of the burst read. The lowest order address bit of the first column address is then toggled to generate a second column address for the third and fourth read cycles of the burst read. Logic 24 then causes logic 23 to repeat the process of alternately asserting the $\overline{CAS3:0}$ and $\overline{CAS7:4}$ signals for the third and fourth cycles of the burst read. By generating the subsequent burst access address in DRAM controller 20, address propagation from either CPU 11 or system bus controller 12 is eliminated for all the subsequent burst addresses, and address delays for those read cycles of the burst read are significantly reduced.

Figure 3:
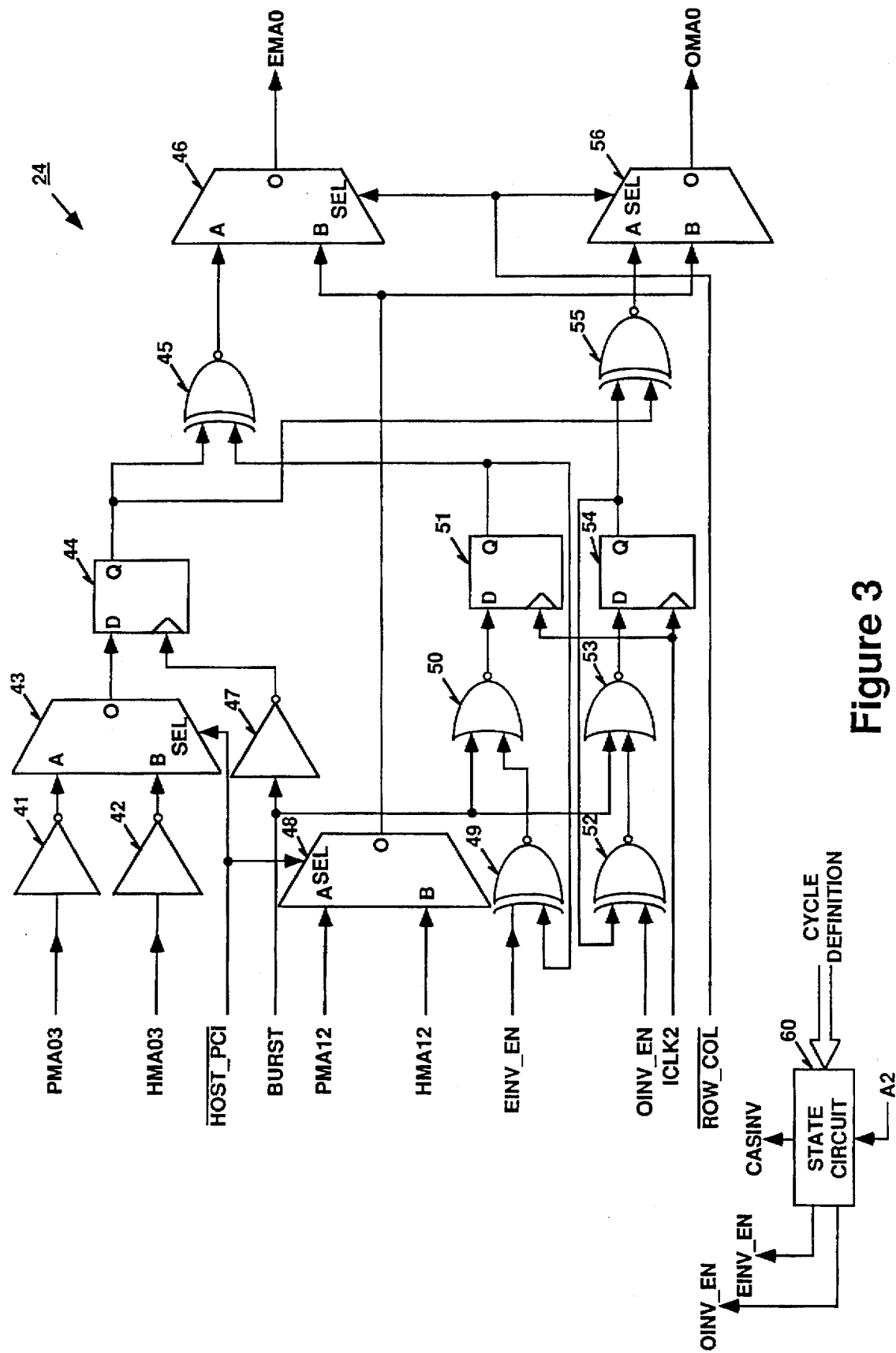
FIG. 3 shows the circuitry of the burst access control logic of FIG. 2, including a state circuit.

FIG. 3 shows the logic of burst access address generation logic 24. As can be seen from FIG. 3, logic 24 includes multiplexers 46 and 56 to selectively apply the lowest order address bit of the row address or the lowest order address bit of the column address to DRAMs 14a–14b. The selection is controlled by row/column selection signal $\overline{ROW\_COL}$. The lowest order address bit of the row address is the $A_{12}$ address bit of the lead-off address. Logic 24 includes a multiplexer 48 to receive the lowest order row address bit. The SMA12 signal indicates that the A12 bit of the lead off address is from the system. The HMA12 signal indicates that the A12 bit of the lead-off address is from the CPU. A $\overline{HOST\_SYSTEM}$ signal is used for the selection.

As described above, the lowest order address bit of the column address is the $A_3$ address bit of the lead-off address. Logic 24 employs multiplexer 43 to select the $A_3$ address bit from either CPU interface 21 or system bus interface 22. Again, the $\overline{HOST\_SYSTEM}$ signal is used for the selection.

Figure 6:
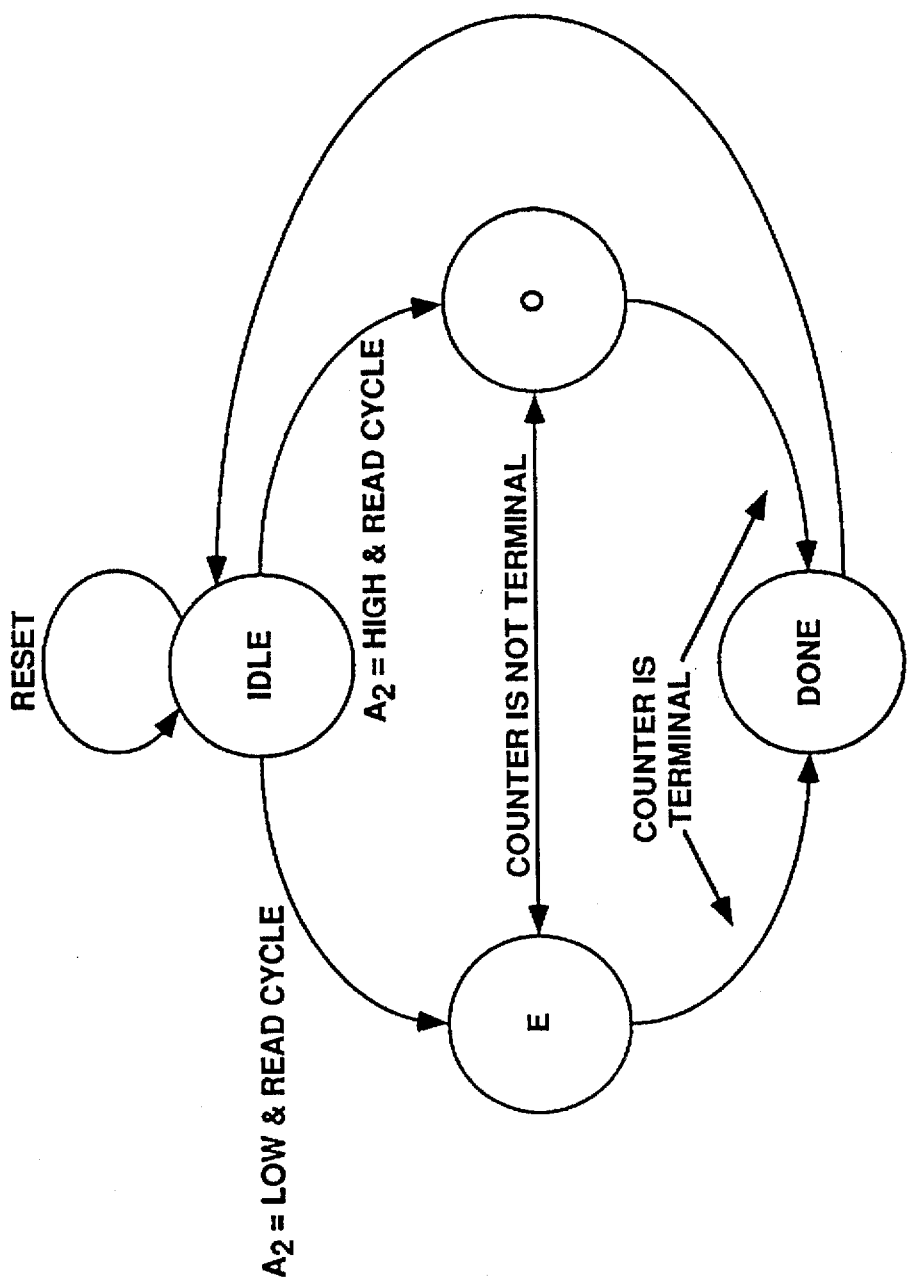
FIG. 6 is a state diagram of the state circuit of FIG. 3.

Logic 24 also includes a state circuit 60. State circuit 60 receives the cycle definition from bus 26 and the address bit $A_2$ of the lead-off address. State circuit 60 generates the address toggle signals OINV_EN and EINV_EN. State circuit 60 also generates a CASINV signal to cause logic 23 to switch between the $\overline{CAS3:0}$ and $\overline{CAS7:4}$ signals. State circuit 60 is a finite state machine and the state diagram of state circuit 60 is shown in FIG. 6, which will be described in more detail below.

The EINV_EN signal controls the inversion of the EMA0 signal when the EMA0 signal represents the lowest order address bit of the column address. This is accomplished by applying the EINV_EN signal to an exclusive NOR gate 45 via exclusive NOR gate 49, NOR gate 50, and D flip flop 51. Similarly, the OINV_EN signal controls the inversion of the OMA0 signal when the OMA0 signal represents the lowest order address bit of the column address. This is accomplished by applying the OINV_EN signal to an exclusive NOR gate 55 via exclusive NOR gate 52, NOR gate 53, and D flip flop 54. As can be seen from FIG. 5, the EINV_EN signal and the OINV_EN signal do not go active at the same time. This ensures that when logics 23–24 apply the column address to one bank of DRAMs 14a–14b for a read, the column address to the other bank of DRAMs 14a–14b is changed.

Referring to FIGS. 2–5, during operation, burst access address generation logic 24 receives address bits $A_2$ and $A_3$ of the lead-off address. Address bit $A_2$ of the lead-off address indicates which one of odd bank DRAM 14a and even bank DRAM 14b that the lead-off address first addresses. When, for example, the $A_2$ address bit indicates that the lead-off address is directed to the odd bank DRAM 14a, burst access address generation logic 24 causes main DRAM controller logic 23 to first generate the $\overline{CAS7:4}$ signal.

Address bit $A_3$ of the lead-off address is mapped to be the lowest order column address $A_0$ to DRAMs 14a–14b and is used to generate the OMA0 and EMA0 signals. During the burst read operation, logic 24 first causes both of the OMA0 and EMA0 signals to be equal to the $A_3$ address bit of the lead-off address when logic 23 applies the column address to DRAMs 14a–14b at the MA11:1 outputs. Logic 24 then toggles the EMA0 and OMA0 signals, respectively, to generate a toggled column address for the third and fourth read cycles of the burst read. As can be seen from FIGS. 3–5, logic 23 first generates the $\overline{CAS7:4}$ signal that applies the OMA0 signal to DRAM 14a as the lowest order column address bit. State circuit 60 then generates the OASINV signal to cause logic 23 to assert the $\overline{CAS3:0}$ signal and to deassert the $\overline{CAS7:4}$ signal. The asserted $\overline{CAS3:0}$ signal then causes the EMA0 signal to be applied to DRAM 14b as the lowest order column address bit for the second read. At this time, state circuit 60 generates the OINV_EN signal to toggle the OMA0 signal. After the OMA0 signal is toggled, state circuit 60 causes logic 23 to assert the $\overline{CAS7:4}$ signal to DRAM 14a for the third read cycle. At this time, state circuit 60 generates the EINV_EN signal to toggle the EMA0 signal. After the third read cycle is complete, state circuit 60 causes logic 23 to assert the $\overline{CAS3:0}$ signal again. This thus completes the four read cycles of the burst read. The state diagram of state circuit 60 is shown in FIG. 6, which is described below.

Referring to FIG. 6, state circuit 60 first is reset at an "IDLE" state. When $A_2$ is logical low and the current cycle is a burst read, state circuit 60 goes to an "E" state in which it causes logic 23 (FIG. 2) to generate the $\overline{CAS3:0}$. When $A_2$ is logical high and it is the burst read cycle, state circuit 60 goes from the "IDLE" state to an "O" state at which the $\overline{CAS7:4}$ signal is generated. At either the "E" or "O" state, state circuit 60 determines if it is the end of the burst read cycle. State circuit 60 does this by having a counter to count how many read cycles DRAM controller 20 has finished. If the counter is not terminal which means the burst read has not completed, state circuit 60 then moves between the "E" and "O" states until the counter is terminal. When the counter is terminal, state circuit 60 moves to a "DONE" state and then returns to the "IDLE" state.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory controller, comprising:
   (a) an input that receives a first memory address for a memory having a first memory bank and a second memory bank; and
   (b) an address and control circuit coupled to the input and the memory, wherein the address and control circuit generates a first column address strobe signal for the first memory bank, a second column address strobe signal for the second memory bank, and a sequence of memory addresses in response to the first memory address, wherein the address and control circuit alternately generates the first and second column address strobe signals to enable each of the first and second memory banks to latch the sequence of memory addresses, respectively.

2. The memory controller of claim 1, wherein the sequence of memory addresses provided by the address and control circuit includes the first memory address and at least a second memory address.

3. The memory controller of claim 2, wherein each of the first and second memory addresses includes a sequence of row address bits and column address bits, each sequence ranging from a most significant bit to a least significant bit, wherein the least significant column address bit in the second memory address is inverted from the least significant column address bit in the first memory address.

4. The memory controller of claim 3, wherein the address and control circuit provides the sequence of memory addresses in an order such that the first memory address is provided before the second memory address is provided.

5. The memory controller of claim 4, wherein the address and control circuit further comprises
   (a) a first output circuit coupled to the input, the first output circuit providing the most significant column address bits in the first and second memory addresses to the first and second memory bank;
   (b) a second output circuit coupled to the input, the second output circuit providing the least significant column address bit in the first and second memory addresses to the first and second memory bank; and
   (c) a timing circuit that sequentially asserts the first and second column address strobe signals to enable the first and second memory banks, respectively, to sequentially latch a combination of bits provided by the first and second output circuits.

6. The memory controller of claim 5, wherein the second output circuit is coupled to the input of the memory controller to receive a first column address bit for controlling the state of the least significant column address bit provided by the second output circuit to the first and second memory banks.

7. The memory controller of claim 6, wherein the second output circuit provides the least significant column address bit of the first memory address by setting that bit equal to the first column address bit received by the second output circuit.

8. The memory controller of claim 7, wherein the second output circuit provides the least significant column address bit of the second memory address by setting that bit equal to the inverse of the first column address bit received by the second output circuit.

9. The memory controller of claim 8, wherein the second output circuit first provides the least significant column address bit in the first memory address to the first and second memory banks and then sequentially provides the least significant column address bit in the second memory address to the first and second memory banks, the sequence being controlled by the state of a second column address bit received by the second output circuit.

10. The memory controller of claim 9, wherein the first column address bit received by the second output circuit is the A3 bit in the first memory address.

11. The memory controller of claim 9, wherein the second column address bit received by the second output circuit is the A2 bit in the first memory address.

12. The memory controller of claim 9, wherein the most significant column address bits of the first memory address provided by the first output circuit are provided throughout a burst read cycle.

13. The memory controller of claim 1, wherein the memory controller is coupled to a microprocessor by a host bus and to a system master by a system bus, and wherein the first memory address received by the memory controller is generated by the microprocessor or the system master.

14. The memory controller of claim 1 wherein the address and control circuit alternately generates the first and second column address strobe signals during a first burst cycle and a second burst cycle.

15. The memory controller of claim 1 wherein the address and control circuit asserts the first column address strobe signal and deasserts the second column address strobe signal during a first burst cycle, and deasserts the first column address strobe signal and asserts the second column address strobe signal during a second burst cycle.

16. A computer memory controller for generating memory control signals and a sequence of memory addresses in response to a first address received by the memory controller, comprising:
   (a) an interface circuit that receives the first address having row address bits and column address bits for addressing a memory having an odd memory bank and an even memory bank;

(b) an address generation circuit coupled to the interface circuit, the address generation circuit receiving at least one of the column address bits and providing a sequence of odd column address bits and a sequence of even column address bits to the odd and even memory banks, respectively; and (c) a control circuit coupled to the interface circuit, the control circuit receiving at least a subset of the column address bits of the first address and providing (1) the subset of column address bits to the odd memory bank and the even memory bank and (2) an odd column address strobe signal to the odd memory bank and an even column address strobe signal to the even memory bank, the odd and even column address strobe signals being alternately asserted to enable the odd and even memory banks to latch combinations of bits output by the address generation circuit and the control circuit, wherein the row address bits and the combinations of bits collectively comprise the sequence of memory addresses, and the odd and even column address strobe signals represent the memory control signals.

17. The memory controller of claim 16, wherein the odd and even column address bits provided by the address generation circuit comprise the least significant column address bits provided to the odd and even memory banks.

18. The memory controller of claim 17, wherein the subset of column address bits provided by the control circuit comprises the most significant column address bits provided to the odd and even memory banks.

19. The memory controller of claim 18, wherein the sequence of odd column address bits and the sequence of even column address bits provided by the address generation circuit begin with a bit having the same state as a first column address bit received by the address generation circuit.

20. The memory controller of claim 19, wherein the address generation circuit includes a state circuit for controlling the state of the sequence of odd and even column address bits output by the address generation circuit.

21. The memory controller of claim 20, wherein a second column address bit received by the address generation circuit is coupled to the state circuit for controlling the state of the sequence of odd and even column address bits output by the address generation circuit.

22. The memory controller of claim 21, wherein the first column address bit received by the address generation circuit is the A3 bit of the first address.

23. The memory controller of claim 22, wherein the second column address bit received by the address generation circuit is the A2 bit of the first address.

24. The memory controller of claim 16, wherein the memory controller is coupled to a microprocessor by a host bus and to a system master by a system bus, and wherein the first address received by the memory controller is generated by the microprocessor or the system master.

25. The computer memory controller of claim 16 wherein the control circuit alternately provides the odd column address strobe signal during a first burst cycle and the even column address strobe signal during a second burst cycle.

26. The computer memory controller of claim 16 wherein the control circuit asserts the odd column address strobe signal and deasserts the even column address strobe signal during a first burst cycle, and deasserts the odd column address strobe signal and asserts the even column address strobe signal during a second burst cycle.

27. A method of operating a memory controller, comprising the steps of:

(a) receiving at an input of the memory controller a first memory address to a memory having a first memory bank and a second memory bank; and (b) outputting to the memory from an address generation and control circuit a first column address strobe signal for the first memory bank, a second column address strobe signal for the second memory bank, and a sequence of memory addresses in response to the first memory address, wherein the first and second column address strobe signals are alternately output to enable each of the first and second memory banks to latch the sequence of memory addresses, respectively.

28. The method of claim 27, wherein the sequence of memory addresses includes the first memory address and at least a second memory address.

29. The method of claim 28, wherein each of the first and second memory addresses includes a sequence of row address bits and column address bits, each sequence ranging from a most significant bit to a least significant bit, wherein the least significant column address bit in the second memory address is inverted from the least significant column address bit in the first memory address.

30. The method of claim 29, further comprising the step of outputting the sequence of memory addresses to the memory in an order such that the first memory address is output before the second memory address.

31. The method of claim 30, wherein the step (b) further comprises the steps of (i) outputting the most significant column address bits in the first and second memory addresses to the first and second memory bank;

(ii) outputting the least significant column address bit in the first and second memory addresses to the first and second memory bank; and (iii) sequentially asserting the first and second column address strobe signals to enable the first and second memory bank, respectively, to sequentially latch a combination of bits output to the first and second memory banks.

32. The method of claim 31, wherein the step (b)(ii) further comprises the steps of (A) setting the least significant column address bit of the first memory address to a state equal to the state of the first column address bit in the first memory address;

(B) setting the least significant column address bit of the second memory address to a state equal to the inverse of the state of the first column address bit in the first memory address.

33. The method of claim 31, wherein the step (b)(ii) further comprises the steps of (i) outputting the least significant column address bit in the first memory address to the first and second memory bank; and (ii) sequentially outputting the least significant column address bit in the second memory address to the first and second memory bank, the sequence being controlled by the state of a second column address bit in the first memory address.

34. The method of claim 27 wherein step (b) further comprises the steps of:

(i) asserting the first column address strobe signal during a first burst cycle;

(ii) deasserting the second column address strobe signal during the first burst cycle;

(iii) deasserting the first column address strobe signal during a second burst cycle; and (iv) asserting the second column address strobe signal during the second burst cycle.

35. A memory controller, comprising:
(a) an input that receives a memory address for a memory having a first memory bank and a second memory bank; and
(b) an address and control circuit coupled to the input and the memory, wherein the address and control circuit generates a first enable signal for the first memory bank and a second enable signal for the second memory bank in response to the first memory address, wherein the address and control circuit alternately generates the first and second enable signals to enable each of the first and second memory banks, respectively, to be addressed by the first memory address and to output data addressed by the first memory address.

36. The memory controller of claim 35, wherein the address and control circuit generates a sequence of memory addresses that include the first memory address and at least a second memory address in response to the first memory address.

37. The memory controller of claim 36, wherein the address and control circuit provides the sequence of memory addresses in an order such that the first memory address is provided before the second memory address is provided.

38. The memory controller of claim 35, wherein the memory controller is coupled to a microprocessor by a host bus and to a system master by a system bus, and wherein the first memory address received by the memory controller is generated by the microprocessor or the system master.

39. The memory controller of claim 35 wherein the control circuit alternately generates the first enable signal in a first burst cycle and the second enable signal in a second burst cycle.

40. The memory controller of claim 35 wherein the control circuit asserts the first enable signal and deasserts the second enable signal during a first burst cycle, and deasserts the first enable signal and asserts the second enable signal during a second burst cycle.

41. A method of operating a memory controller, comprising the steps of:
(a) receiving at an input of the memory controller a first memory address to a memory having a first memory bank and a second memory bank; and
(b) outputting to the memory from an address generation and control circuit a first enable signal for the first memory bank and a second enable signal for the second memory bank in response to the first memory address, wherein the first and second enable signals are alternately output to enable each of the first and second memory banks, respectively, to be addressed by the first memory address and to output data addressed by the first memory address.

42. The method of claim 41, further including the step of outputting to the memory a sequence of memory addresses in response to the first memory address, wherein the sequence of memory addresses include the first memory address and at least a second memory address.

43. The method of claim 42, further comprising the step of outputting the sequence of memory addresses to the memory in an order such that the first memory address is output before the second memory address.

44. The method of claim 41 wherein step (b) further comprises the steps of:
(i) asserting the first enable signal during a first burst cycle;
(ii) deasserting the second enable signal during the first burst cycle;
(iii) deasserting the first enable signal during a second burst cycle; and
(iv) asserting the second enable signal during the second burst cycle.

* * * * *